United States Patent
Yoshikawa et al.

(10) Patent No.: US 7,790,339 B2
(45) Date of Patent: Sep. 7, 2010

(54) PHOTOMASK BLANK

(75) Inventors: Hiroki Yoshikawa, Joetsu (JP); Yukio Inazuki, Joetsu (JP); Satoshi Okazaki, Joetsu (JP); Takashi Haraguchi, Tokyo (JP); Tadashi Saga, Tokyo (JP); Yuichi Fukushima, Tokyo (JP)

(73) Assignees: Shin-etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 522 days.

(21) Appl. No.: 11/785,689

(22) Filed: Apr. 19, 2007

(65) Prior Publication Data
US 2007/0248897 A1 Oct. 25, 2007

(30) Foreign Application Priority Data
Apr. 21, 2006 (JP) .............................. 2006-117327

(51) Int. Cl.
*G03F 1/00* (2006.01)
(52) U.S. Cl. .......................................................... 430/5
(58) Field of Classification Search ...................... 430/5; 428/428, 430
See application file for complete search history.

(56) References Cited

U.S. PATENT DOCUMENTS

| | | |
|---|---|---|
| 4,707,218 A | 11/1987 | Giammarco et al. |
| 5,474,864 A | 12/1995 | Isao et al. |
| 5,482,799 A | 1/1996 | Isao et al. |
| 5,523,185 A | 6/1996 | Goto |
| 5,592,317 A | 1/1997 | Fujikawa et al. |
| 6,037,083 A | 3/2000 | Mitsui |
| 6,335,124 B1 | 1/2002 | Mitsui et al. |
| 6,395,433 B1 | 5/2002 | Smith |
| 6,599,667 B2 | 7/2003 | Yusa et al. |
| 2001/0006754 A1 | 7/2001 | Okazaki et al. |
| 2002/0058186 A1 | 5/2002 | Nozawa et al. |
| 2002/0115003 A1 | 8/2002 | Tsukamoto et al. |
| 2003/0077520 A1 | 4/2003 | Smith |

(Continued)

FOREIGN PATENT DOCUMENTS

EP 1 152 292 A2 11/2001

(Continued)

OTHER PUBLICATIONS

European Search Report issued on Dec. 4, 2009 in corresponding European Patent Application No. 07 25 1604.

(Continued)

*Primary Examiner*—Stephen Rosasco
(74) *Attorney, Agent, or Firm*—Birch, Stewart, Kolasch & Birch, LLP

(57) ABSTRACT

A photomask blank has a light-shielding film composed of a single layer of a material containing a transition metal, silicon and nitrogen or a plurality of layers that include at least one layer made of a material containing a transition metal, silicon and nitrogen, and has one or more chrome-based material film. The high transition metal content ensures electrical conductivity, preventing charge-up in the photomask production process, and also provides sufficient chemical stability to cleaning in photomask production. The light-shielding film has a good resistance to dry etching of the chrome-based material film in the presence of chlorine and oxygen, thus ensuring a high processing accuracy.

7 Claims, 5 Drawing Sheets

U.S. PATENT DOCUMENTS

| | | |
|---|---|---|
| 2003/0180631 A1 | 9/2003 | Shiota et al. |
| 2004/0072081 A1 | 4/2004 | Coleman et al. |
| 2004/0229136 A1 | 11/2004 | Kaneko et al. |
| 2005/0019674 A1 | 1/2005 | Okubo et al. |
| 2005/0042526 A1 | 2/2005 | Lee et al. |
| 2005/0142463 A1 | 6/2005 | Mitsui et al. |
| 2005/0170263 A1 | 8/2005 | Mitsui et al. |
| 2005/0190450 A1 | 9/2005 | Becker et al. |
| 2006/0051681 A1 | 3/2006 | Taylor |
| 2006/0057469 A1 | 3/2006 | Kureishi et al. |
| 2007/0212618 A1 | 9/2007 | Yoshikawa et al. |
| 2007/0212619 A1 | 9/2007 | Yoshikawa et al. |

FOREIGN PATENT DOCUMENTS

| | | |
|---|---|---|
| EP | 1 321 820 A1 | 6/2003 |
| EP | 1 439 418 A2 | 7/2004 |
| EP | 1 832 925 A2 | 9/2007 |
| EP | 1 832 926 A2 | 9/2007 |
| JP | 63-85553 A | 4/1988 |
| JP | 1-142637 A | 6/1989 |
| JP | 3-116147 A | 5/1991 |
| JP | 4-246649 A | 9/1992 |
| JP | 6-95358 A | 4/1994 |
| JP | 6-95363 A | 4/1994 |
| JP | 7-140635 A | 6/1995 |
| JP | 10-148929 A | 6/1998 |
| JP | 2001-312043 A | 11/2001 |
| JP | 3093632 U | 2/2003 |
| JP | 2003-195479 A | 7/2003 |
| JP | 2003-195483 A | 7/2003 |
| JP | 2006-78807 A | 3/2006 |

OTHER PUBLICATIONS

European Search Report issued on Nov. 26, 2007 in EP Application No. 07 25 1015.

European Search Report issued on Nov. 6, 2009 in EP Application No. 07 25 1007.

PHOTOMASK BLANK

CROSS-REFERENCE TO RELATED APPLICATION

This non-provisional application claims priority under 35 U.S.C. §119(a) on Patent Application No. 2006-117327 filed in Japan on Apr. 21, 2006, the entire contents of which are hereby incorporated by reference.

BACKGROUND OF THE INVENTION

1. Field of the Invention

The present invention relates to a photomask blank for making photomasks used in the fabrication of semiconductor integrated circuits, charge-coupled devices (CCD), color filters for liquid crystal displays (LCD), magnetic heads and the like.

2. Prior Art

In semiconductor fabrication, the increasing level of integration in large-scale integrated circuits in particular has led to a growing need in recent years for circuit patterns of smaller geometries. This need has intensified the desire for technology to reduce the size of features in the wiring patterns that make up a circuit and technology to reduce the size of features in contact hole patterns for the interlayer connections that make up a cell. Accordingly, in the production of photomasks onto which circuit patterns have been written and which are used in photolithography to form such wiring patterns and contact hole patterns, there exists a need for a technology which, in keeping with the above trend toward smaller geometries, is capable of writing circuit patterns to even smaller dimensions and a higher accuracy.

To create a photomask pattern of even higher accuracy on a photomask substrate, it is first necessary to form a highly accurate resist pattern on the photomask blank. Because photolithography during the processing of an actual semiconductor substrate involves carrying out reduction projection, the photomask pattern is about four times larger than the size of the pattern actually required. However, this does not mean that the need for accuracy can be relaxed accordingly. Indeed, the photomask serving as the master must have a level of accuracy that is higher than that required of the pattern after exposure.

Moreover, in lithography as it is already currently practiced, the dimensions of the circuit pattern to be written are substantially smaller than the wavelength of the light used for exposure. Hence, when a photomask pattern bearing a circuit shape that has been enlarged four-fold is used, owing to such effects as the light interference that arises during actual photolithography, the photomask pattern is not transferred in the same exact shape to the resist film. To reduce such effects, it is sometimes necessary to carry out processing which gives the photomask pattern a shape that is more complex than the actual circuit pattern—that is, a shape obtained by the application of, for example, optical proximity correction (OPC). Accordingly, in lithographic technology for patterning photomasks as well, there exists a desire today for processing methods of even higher accuracy. The lithographic performance is sometimes referred to as the "minimum resolution." It is desired that the lithographic technology used in photomask-making operations have a resolution limit which represents an accuracy that is substantially equal to or greater than that of the resolution limit required in the photolithography employed in semiconductor fabrication where the photomask is used.

Typically, in the formation of a photomask pattern, a layer of photoresist is deposited on a photomask blank composed of a transparent substrate having a light-shielding film thereon. A pattern is written onto the photoresist film by exposure to electron beams and development is carried out, thereby giving a resist pattern. Next, the light-shielding film is etched using the resist pattern as the etching mask, thereby forming a light-shielding pattern. When a light-shielding pattern of smaller minimum feature size is to be formed, if processing is attempted with a resist film of about the same thickness as that used prior to scaling down of the dimensions, the ratio of the film thickness to the size of pattern features, i.e., the aspect ratio, increases and the resist pattern shape degrades, preventing pattern transfer from being properly carried out. In some cases, the resist pattern may even collapse or separate from the substrate. It is thus necessary to reduce the thickness of the resist film in keeping with such reductions in feature size.

As for the light-shielding film material that is etched using a resist as the etching mask, although numerous materials have hitherto been described in the art, chromium compound films are almost always used in practice, owing to the extensive knowledge that exists concerning the etching of such films and the fact that the standard processing operations are well-established.

However, the oxygen-containing chlorine-based dry etch commonly used for dry etching chrome-based films such as chromium compound films often also etches organic films to some degree. As a result, when such etching is carried out using a thin resist film, it is difficult to accurately transfer the resist pattern. How to require of a resist that it have an etch resistance which enables etching to be carried out to a high resolution and to a high accuracy has been a daunting challenge. Hence, to achieve both a high resolution and a high accuracy, light-shielding film materials need to be reexamined so that a change can be made from an approach which relies exclusively on resist performance to an approach which also enhances the performance of the light-shielding film.

As one way of addressing this problem, the inventors have earlier found that metal silicide-based materials provide a higher light-shielding performance per unit film thickness than chrome-based materials, particularly at exposure wavelengths below 250 nm (see JP-A 2006-78807). They have also shown that, although transition metal silicide-based materials, when placed in a low oxidation state, are at risk of having a diminished chemical stability to ammonia/hydrogen peroxide aqueous solution or the like commonly used in cleaning, by setting the proportion of transition metal (transition metal/(transition metal+silicon)) in such a material to 20% or less, the material can be assured of having the necessary chemical stability at the time of photomask fabrication. In addition, the inventors have reported that, when a chrome-based material is used to form an antireflective film, differences in the etch selectivities of the metal silicide-based material and the chrome-based material enable mutually selective etching to be carried out. That is, by using a chrome-based material film as a hardmask, the load on the resist film that is initially deposited decreases, enabling high-precision etching to be carried out even at a lower resist film thickness.

The use of e-beam lithography in the production of photomasks is well known. Although e-beam lithography, when used to repeatedly write the same pattern, does have a lower efficiency than photolithography with a mask, it is advantageous for forming patterns of smaller geometry and is thus better suited for photomask production than photolithography. Attempts have been made recently to increase the current density during electron beam irradiation, the goal being to improve the e-beam exposure system and raise throughput. However, there is a possibility that increasing the current density at this time will tend to give rise to a "charge-up" effect during e-beam writing.

As noted above, the inventors earlier disclosed the use of transition metal silicide compounds instead of conventional chrome-based materials as a more advantageous light-shielding film material in photomasks adapted for use with low-wavelength exposure light. However, the chemical stability desired of the light-shielding film material in a photomask makes it necessary to ensure that the silicon content, expressed as silicon/(silicon+transition metal), exceed 80%. Yet, the desire for a material which is less prone to charge-up will most likely give rise to a need for an electrical conductivity that is higher than the range which has hitherto been required. The inventors anticipated that, in order to obtain a light-shielding film made with a transition metal silicide compound that achieves a comparable functionality using light having a wavelength of 250 nm or less, it would be possible to increase the conductivity by raising the transition metal concentration. However, given the existing knowledge that there is no assurance of chemical stability when a light-shielding film material having a silicon content of 80% or less is used, it became apparent that a new approach would be needed to ensure the chemical stability.

SUMMARY OF THE INVENTION

It is therefore an object of the present invention to provide a photomask blank with substantially problem-free chemical stability in a transition metal silicide having a silicon content, expressed as silicon/(silicon+transition metal), of less than 80 atom %. Such a transition metal silicide, although previously thought to be difficult to use in the production of photomask patterns of smaller geometries, particularly as a light-shielding film material in the photomasks of smaller geometry required to carry out photolithography using exposure light having a wavelength of 250 nm or less (e.g., ArF excimer laser), is beneficial as a means for conferring a higher electrical conductivity.

The inventors have discovered that by giving the transition metal silicide a relatively low silicon content and also including some degree of nitrogen in the composition, electrical conductivity and chemical stability are both achieved without a substantial loss in the light-shielding performance. That is, films which are rendered semi-transparent by adding a relatively large amount of nitrogen or nitrogen and oxygen to a transition metal silicide and thus increasing the oxidation number, have hitherto been used as halftone films and confirmed to be chemically stable. However, the inventors have found that even transition metal silicides having a relatively low silicon content, when a certain amount of nitrogen is included in the composition, can maintain chemical stability at an oxidation level that allows the silicide to be fully functional as a light-shielding film. Moreover, they have discovered that giving the transition metal silicide light-shielding film a nitrogen-containing composition not only ensures chemical stability to the mask cleaning conditions, it also increases the dry etch resistance of the light-shielding film under dry etching conditions that include the presence of chlorine and oxygen. Hence, when such a light-shielding film is used in combination with a chrome-based film, a high processing accuracy can be achieved.

Accordingly, the invention provides a photomask blank for producing a photomask having a transparent substrate provided thereon with a mask pattern of regions transparent to and regions substantially opaque to an exposure light, which photomask blank includes both a light-shielding film composed of a single layer made of a material containing a transition metal, silicon and nitrogen or a plurality of layers that include at least one layer made of a material containing a transition metal, silicon and nitrogen, and one or more chrome-based material film. The material containing a transition metal, silicon and nitrogen has an atomic ratio of silicon to transition metal, expressed as silicon/transition metal, of at least 1:1 but less than 4:1, and has a nitrogen content of least 5 atom % but not more than 40 atom %.

In a preferred aspect of the invention, the layer made of a material containing a transition metal, silicon and nitrogen has a combined amount of transition metal and silicon, as a proportion of the material making up the layer, of at least 60 atom %.

The chrome-based material film may be formed in a side of the light-shielding film that is away from the transparent substrate, in which case the chrome-based material film may form part or all of an antireflective film or may be an etching mask film.

Alternatively, the chrome-based material film may be deposited between the transparent substrate and the light-shielding film, in which case the chrome-based material film may be an etching stopper film.

Films that are rendered semi-transparent by adding a relatively large amount of nitrogen or nitrogen and oxygen to a transition metal silicide and thereby increasing the oxidation number, have hitherto been used as halftone films and confirmed to be chemically stable. However, the material containing a transition metal, silicon and nitrogen used in the present invention ensures chemical stability at an oxidation level that enables the material to be fully functional as a light-shielding film.

Because of its high transition metal content, the photomask blank of the invention is electrically conductive, and thus has the ability to prevent charge-up in the photomask production process, in addition to which it also has good chemical stability to cleaning in the photomask production process. Moreover, in the inventive photomask blank, because the layer made of a material containing a transition metal, silicon and nitrogen within the light-shielding film has a nitrogen content of at least 5 atom %, it exhibits a high resistance to dry etching conditions that include chlorine and oxygen. When the photomask blank also has, together with such a layer, a chrome-based material film other than simply an antireflective film, such as an etching mask film or an etching stopper film made of the subsequently described chrome-based material, after the layer made of the material containing a transition metal, silicon and nitrogen has been patterned in a patterning operation, the chrome-based material film provided together with this layer may need to be subjected to a dry etching step under etching conditions that include the presence of chlorine and oxygen. Yet, even when such a dry etching step is carried out, problems such as side etching are prevented by the high etch resistance mentioned above, enabling a high processing accuracy to be achieved.

BRIEF DESCRIPTION OF THE DIAGRAMS

FIG. 1 shows examples of photomask blanks according to the invention.

Figure 1A:
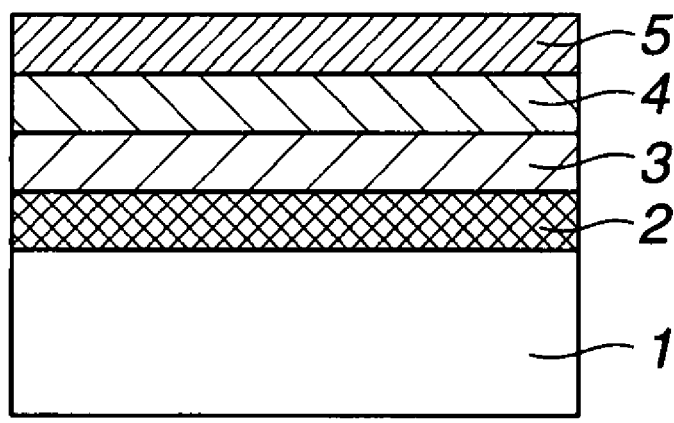
FIG. 1A is a cross-sectional view of a photomask blank in which the light-shielding film has been placed directly on the transparent substrate.

FIG. 3 shows steps in the production of a photomask from a photomask blank according to the invention. Each diagram depicts a step in the production of a zebra-type chromeless mask (Fabrication Example B). FIGS. 3A, C, E, G and I are cross-sectional views, and FIGS. 3B, D, F, H and J are top views.

FIG. 4 shows steps in the production of a photomask from a photomask blank according to the invention. The diagrams depict steps in the production of a zebra-type chromeless mask (Fabrication Example B) subsequent to the steps shown in FIG. 3. FIGS. 4A, C, E, G and I are cross-sectional views, and FIGS. 4B, D, F, H and J are top views.

FIG. 5 shows steps in the production of a photomask from a photomask blank according to the invention. The diagrams depicts steps in the production of a tritone phase shift mask (Fabrication Example C).

DETAILED DESCRIPTION OF THE INVENTION

The photomask blank of the invention is a photomask blank for producing a photomask having a transparent substrate provided thereon with a mask pattern of regions transparent to and regions substantially opaque to an exposure light. The inventive photomask includes both a light-shielding film composed of a single layer made of a material containing a transition metal, silicon and nitrogen or a plurality of layers that include at least one layer made of a material containing a transition metal, silicon and nitrogen, and one or more chrome-based material film. The material containing a transition metal, silicon and nitrogen which makes up the light-shielding film has an atomic ratio of silicon to transition metal, expressed as silicon/transition metal, of at least 1:1 but less than 4:1 (that is, $1 \leq$ (silicon/transition metal)$<4$), and has a nitrogen content of least 5 atom % but not more than 40 atom %.

In the photomask blank of the invention, the light-shielding film may be a one-layer film or a multilayer film. At least one of the layers making up this film contains a transition metal, silicon and nitrogen, the atomic ratio of silicon to transition metal, expressed as silicon/transition metal, being at least 1:1 but less than 4:1 ($1 \leq$ (silicon/transition metal)$<4$), and preferably from 1:1 to 3:1 ($1 \leq$ (silicon/transition metal)$\leq 3$). Electrical conductivity is easily conferred by including the transition metal in a proportion, expressed as transition metal/(transition metal+silicon), of more than 20%, and preferably at least 25%.

It was previously confirmed that when more than 20%, and especially 25% or more, of transition metal is included, a loss occurs in the chemical stability required in, for example, the cleaning operation with ammonia/hydrogen peroxide aqueous solution that is employed in photomask production. However, by including from 5 to 40 atom % of nitrogen in the film, chemical stability can be achieved even when the silicon to transition metal ratio lies within the above range.

It has hitherto been known in the art that films having a high oxidation state of the sort used as semi-transparent films are particularly chemically stable when they contain nitrogen (JP-A 10-148929). Moreover, in the case of elements such as molybdenum, tantalum, zirconium, hafnium and silicon, the oxides of which have a high chemical stability, greater stability was thought to be attainable at higher oxidation states, although it has not previously been possible to ensure chemical stability at low oxidation states of the sort associated with use as a light-shielding film. By contrast, in the present invention, chemical stability can be achieved at a low oxidation state; that is, when the combined amount of the transition metal and silicon accounts for at least 60 atom %, and especially at least 65 atom %, of the overall material.

The amount of nitrogen included is at least 5 atom % but not more than 40 atom %, and preferably at least 5 atom % but not more than 35 atom %. At less than 5 atom %, sufficient chemical stability cannot be ensured. On the other hand, at above 40 atom %, particularly when the film is employed as a light-shielding film for the production of a photomask for exposure to an ArF excimer laser, a use for which the present invention is well-suited, the film thickness must be made very large, causing substrate strain and making it necessary to increase the thickness of the resist film in microfabrication to, e.g., 250 nm or more, which is undesirable for practical purposes.

At the same time, the light-shielding film is required to have chemical stability so that the film thickness does not change during cleaning. In the case of photomasks for ArF exposure, the change in film thickness on cleaning is required to be not more than 3 nm. However, under the cleaning conditions essential to the photomask production process, particularly cleaning with sulfuric acid/hydrogen peroxide aqueous solution (sulfur acid peroxide mixture), the light-shielding film incurs damage, making it essential to pay close attention to the loss of light-shielding performance. When the material making up the light-shielding film has an atomic ratio of silicon to transition metal, expressed as silicon/transition metal, of less than 4:1 (silicon/transition metal$<4$), in the absence of nitrogen, the film lacks chemical stability to the above conditions; in particular, at a silicon/transition metal ratio of 1:1, it will readily dissolve. However, if at least 5 atom % of nitrogen is included, chemical stability to the above conditions of a degree that resolves the above practical problems is ensured.

Attention must also be paid to the electrical conductivity of the film so as to prevent charge-up from occurring at the time of e-beam irradiation in lithography for patterning the mask. The necessary conductivity can be achieved so long as the silicon to transition metal ratio is less than 4:1; i.e., silicon/transition metal$<4$.

Preferred examples of the transition metal in this light-shielding film include molybdenum, tantalum, zirconium and hafnium. From the standpoint of amenability to dry etching, molybdenum is most preferred.

For the film on the photomask to function as a film having sufficient light-shielding ability, in a commonly used binary mask blank having a light-shielding film and an antireflective film, it is required that the light-shielding film and the antireflective film, as well as the subsequently described etching stopper film in cases where the blank has that film as well, and additionally, in a halftone phase shift mask blank, the halftone phase shift film, collectively have an optical density (OD) to the exposure light of at least 2.5, preferably at least 2.8, and most preferably at least 3.0.

The material containing a transition metal, silicon and nitrogen which makes up the light-shielding film may also include as additional components light elements such as oxygen and carbon, although sufficient light-shielding properties may not be achieved if more than a given amount of these lighter elements is included. Hence, photomask blanks for exposure to light having a wavelength of 193 nm or less—to which the invention is especially applicable, particularly photomask blanks for exposure to an ArF excimer laser having a wavelength of 193 nm, have a carbon content of preferably not more than 20 atom % and an oxygen content of preferably not more than 10 atom %, and most preferably have a combined amount of nitrogen, carbon and oxygen of not more than 40 atom %. Likewise, it is preferable for the combined amount of the transition metal and silicon as a proportion of the overall material to be at least 60 atom %, and especially at least 65 atom %.

The light-shielding film layer composed of a material containing a transition metal, silicon and nitrogen may be deposited by a known method. Deposition by sputtering is customarily used because this is the method by which a layer of excellent uniformity can most easily be obtained. In the present invention as well, a sputtering process is the preferred method of deposition. Sputtering may be carried out using solely a target in which the ratio of silicon and transition metal contained has been adjusted as appropriate. Alternatively, the ratio of silicon and transition metal may be adjusted by suitably selecting from among silicon targets, transition metal targets and targets made of silicon and transition metal (transition metal silicide targets), and adjusting the sputtering surface area of the target or the power applied to the target. To include nitrogen and, in some cases, other elements such as oxygen and carbon, in the layer made of the material containing a transition metal, silicon and nitrogen, deposition may be carried out by reactive sputtering in which a nitrogen-containing gas or a gas which additionally contains oxygen and carbon is suitably introduced as a reactive gas to the sputtering gas.

The foregoing light-shielding film is more useful in combination with a chrome-based material film. If the chrome-based material film is, in particular, an etching mask film or an etching stopper film of the sort subsequently described, after the film containing silicon, a transition metal and nitrogen has been patterned, the chrome-based material will have to be stripped off or patterned. Yet, even when the atomic ratio of silicon to transition metal (silicon/transition metal) in the material containing a transition metal, silicon and nitrogen is at least 1:1 but less than 4:1, should the material used contain no nitrogen, it has been found that under the etching conditions for the chrome-based material film, i.e., a dry etch which includes chlorine and oxygen, there is a risk that part of the pattern will incur etching, especially side etching. Such side etching can be effectively inhibited by including at least 5 atom % of nitrogen, even when the atomic ratio of silicon to transition metal (silicon/transition metal) is at least 1:1 but less than 4:1.

The photomask blank of the invention has on the transparent substrate a light-shielding film and one or more chrome-based material film, which chrome-based material film may be deposited in a side of the light-shielding film that is away from the transparent substrate, or may be deposited between the transparent substrate and the light-shielding film. In the former case, the chrome-based material film may form part or all of an antireflective film and/or may form an etching mask film. In the latter case, the chrome-based material film may form an etching stopper film. Moreover, where necessary, other films may be provided between, respectively, the transparent substrate and the light-shielding film, the transparent substrate and the chrome-based material film, or the light-shielding film and the chrome-based material film. For example, a semi-transparent film, or a phase shift film which is semi-transparent or transparent to the exposure light, may be provided between the transparent substrate and the light-shielding film.

Because the etching stopper film and the etching mask film must have etch selectivities which differ markedly from that of the light-shielding film layer made of a material containing a transition metal, silicon and nitrogen, it is preferable for these films to have physical properties that enable them to be dry-etched under conditions where the etch rate in fluorine-based dry etching is low and metal silicide-based materials have dry etch resistance. Given this requirement, selection from among chrome-based materials is preferred. In cases where an etching mask film is not used, a method in which part or all of the antireflective film and also part of the light-shielding film (some portion of the layers if the light-shielding film has a plurality of layers) is made of a chrome-based material and the resist pattern is first transferred to the film (layer) made of chrome-based material, following which the etching conditions are changed and pattern transfer by dry etching is carried out to a metal silicide-based material (part of the antireflective film not made of a chrome-based material, and part or all of the light-shielding film not made of a chrome-based material) is preferred because the resist film can be made thinner, enabling a pattern of small dimensions to be formed to a high accuracy.

An etching stopper film is useful when the inventive photomask blank is a phase shift mask blank. Whether the phase shifting portions of the phase shift mask are to be transparent or semi-transparent to the exposure light, in fashioning the phase shift mask, it is customary to pattern the light-shielding film and also to form the phase shift pattern, then to strip off part of the light-shielding film on the phase shift pattern. However, when a material containing a transition metal and silicon is used in the light-shielding film, there is a risk that fluorine-based dry etching, which is the most effective dry etching method for stripping such a material, may damage the phase shift portions and the transparent substrate during processing.

In such a case, by providing an etching stopper film between the transition metal, silicon and nitrogen-containing light-shielding film and the phase shifting portion-forming material (i.e., the transparent substrate or a phase shift film) and, for example, transferring the pattern of the phase shifting portion, first to the light-shielding film then to the etching stopper film, subsequently forming a resist pattern to protect the portions of the light-shielding film that are to be left behind, then carrying out dry etching treatment of the phase shifting portions, the portions of the light-shielding film that are to be stripped off are at the same time removed. By then stripping off the etching stopper film under dry etching conditions that include the presence of chlorine and oxygen, unnecessary portions of the light-shielding film can be stripped off without damaging the phase shifting portions or the transparent substrate.

The etching mask film (as used herein, "etching mask film" refers to a film which functions as an etching mask when dry etching a film provided on the transparent substrate side thereof (lower layer film) and, because it is completely stripped following use, does not remain on the completed mask), when both an antireflective film and an etching mask film are provided on the side of the light-shielding film away from the transparent substrate, is a film which is disposed on the side of the antireflective film away from the transparent base and functions as an etching mask during the etching of a lower layer film.

In particular, when the antireflective film in a phase shift mask blank is also made of a material containing a transition metal and silicon, during processing of the phase shift portions, the antireflective film which would otherwise undergo etching under the same conditions must be robustly protected. However, increasing the thickness of the resist film in order to provide such protection may be disadvantageous in that the resist pattern itself is then more difficult to fabricate at small dimensions. Hence, from the standpoint of microfabrication, it is desirable to protect the antireflective film with a material having different etch properties than the antireflective film, in which case first the resist pattern is transferred to the etching mask film, then etching of the lower layer film is carried out using the etching mask pattern as the etching mask.

The etching mask film and the etching stopper film may each be composed of either a single layer or a plurality of layers, or may have a gradient composition (i.e., a composition which continuously or discontinuously changes in the film thickness direction). The chrome-based material used here is preferably uncombined chromium or a chromium compound containing chromium and one or more selected from among oxygen, nitrogen and carbon; and more preferably a chromium compound containing chromium, oxygen and/or nitrogen. A chromium compound which does not contain silicon is preferred. Illustrative examples of preferred chromium compounds include chromium oxides, chromium nitrides, chromium oxynitrides, chromium oxycarbides, chromium carbonitrides and chromium oxycarbonitrides.

In the case of an etching mask film, because the etching resistance, which varies also particularly with film thickness, improves at a chromium content of 50 atom % or more, and especially 60 atom % or more, by using uncombined chromium or a chromium compound containing chromium in the foregoing range, a film that may be expected to have a high etching mask effect can be obtained without having the etching mask film be very thick.

An etching mask film which provides a sufficient etch selectivity to the light-shielding film and/or the transparent substrate may be obtained by giving the chrome-based material of which the etching mask film is made a chromium content of from 50 to 100 atom %, especially 60 to 100 atom %; an oxygen content of from 0 to 50 atom %, especially 0 to 40 atom %; a nitrogen content of from 0 to 50 atom %, especially 0 to 40 atom %; and a carbon content of from 0 to 20 atom %, especially 0 to 10 atom %.

In the case of an etching stopper film, because the desired aim is achievable if, basically, the etch selectivity with respect to a film containing a transition metal, silicon and nitrogen is large, the etching stopper film can be made of a chrome-based material similar to that of which the above-described etching mask film is composed. However, when it is desired that an etching stopper film provided between the transparent substrate and the light-shielding film have a strong etching mask effect in processing steps for the production of, e.g., a chromeless mask, it is preferable to select one of the materials listed above as preferred examples of chrome-based materials for an etching mask film.

When an etching mask film made of the above-described chrome-based material is provided, to facilitate stripping of the etching mask film, it is preferable for the antireflective film to be made of a material containing a transition metal and silicon. When a material containing a transition metal and silicon is used in the antireflective film, the antireflective film may be composed of a single layer or a plurality of layers, or may be a material in which the composition is graduated.

Preferred examples of the transition metal in this antireflective film include molybdenum, tantalum, zirconium and hafnium. From the standpoint of the amenability of the film to dry etching, molybdenum is most preferred.

When the antireflective film is made of a material containing a transition metal and silicon, it is preferable for the composition to have a silicon content of from 10 to 80 atom %, especially from 30 to 50 atom %; an oxygen content of from 0 to 60 atom %, especially 0 to 40 atom %; a nitrogen content of from 0 to 57 atom %, especially 20 to 50 atom %; a carbon content of from 0 to 20 atom %, especially 0 to 5 atom %; and a transition metal content of from 0 to 35 atom %, especially from 1 to 20 atom %. When the composition of the antireflective film is graduated in the thickness direction, it is preferable for the composition of this antireflective film to have a silicon content of from 0 to 90 atom %, especially from 10 to 90 atom %; an oxygen content of from 0 to 67 atom %, especially 5 to 67 atom %; a nitrogen content of from 0 to 57 atom %, especially 5 to 50 atom %; a carbon content of from 0 to 20 atom %, especially 0 to 5 atom %; and a transition metal content of from 0 to 95 atom %, especially from 1 to 20 atom %.

When an etching mask film is not provided, part of the antireflective film on the side away from the transparent substrate (surface layer side) or all of the antireflective film may be composed of a chrome-based material, and the portions of the film that are made of this chrome-based material may be conferred with an etching mask function. If an even stronger etching mask function is desired, in addition to the antireflective film, a part of the light-shielding film may also be made of chrome-based material. By using a material having different etching properties in the antireflective film, etc., when processing is carried out in which the etching conditions are changed in the course of etching the entire light-shielding film, the load on the resist film used in processing can be reduced and the thickness of the resist layer can be made smaller, enabling fabrication to a smaller minimum feature size.

The antireflective film may be composed of a single layer or a plurality of layers, or may have a gradient composition. The chrome-based material making up the antireflective film and the light-shielding film is preferably uncombined chromium or a chromium compound containing chromium and one or more selected from among oxygen, nitrogen and carbon; and more preferably a chromium compound containing chromium in combination with oxygen and/or nitrogen. A chromium compound which does not contain silicon is preferred. Illustrative examples of preferred chromium compounds include chromium oxides, chromium nitrides, chromium oxynitrides, chromium oxycarbides, chromium carbonitrides and chromium oxycarbonitrides.

When the antireflective film is made of a chrome-based material, it is preferable for the material to have a chromium content of from 30 to 70 atom %, especially 35 to 50 atom %; an oxygen content of from 0 to 60 atom %, especially 20 to 60 atom %; a nitrogen content of from 0 to 50 atom %, especially 3 to 30 atom %; and a carbon content of from 0 to 20 atom %, especially 0 to 5 atom %. When the composition is graduated in the thickness direction, it is preferable for the antireflective film composition to have a chromium content of from 30 to 100 atom %, especially 35 to 90 atom %; an oxygen content of from 0 to 60 atom %, especially 3 to 60 atom %; a nitrogen content of from 0 to 50 atom %, especially 3 to 50 atom %; and a carbon content of 0 to 30 atom %, especially 0 to 20 atom %.

When part of the light-shielding film is made of a chrome-based material, it is preferable for the chrome-based material to have a chromium content of from 50 to 100 atom %, especially from 60 to 100 atom %; an oxygen content of from 0 to 50 atom %, especially from 0 to 40 atom %; a nitrogen content of from 0 to 50 atom %, especially 0 to 40 atom %; and a carbon content of from 0 to 20 atom %, especially from 0 to 10 atom %. When part of the light-shielding film has a composition which is graduated in the thickness direction of the film, it is preferable for the light-shielding film composition to have a chromium content of from 50 to 100 atom %, especially 60 to 100 atom %; an oxygen content of from 0 to 60 atom %, especially 0 to 50 atom %; a nitrogen content of from 0 to 50 atom %, especially 0 to 40 atom %; and a carbon content of from 0 to 20 atom %, especially 0 to 10 atom %.

Deposition of the above films composed of a chrome-based material may be carried out by conventional methods for depositing chrome-based light-shielding films and antireflective films that are familiar to the art. Deposition of the etching stopper film and the etching mask film may also be carried out using similar methods. In one suitable method that is commonly employed, deposition is carried out by sputtering with a chromium target and in a stream of inert gas such as argon, a reactive gas such as an oxygen-containing gas, a nitrogen-containing gas or a carbon-containing gas, or a mixed gas composed of an inert gas and a reactive gas (e.g., see JP-A 7-140635).

To provide a satisfactory light-shielding performance and also to achieve the above-indicated optical density, it is preferable for the light-shielding film to have a thickness which, although dependent also on the material used, the optical density and other properties of the antireflective film, and the presence or absence of an etching stopper film, is generally at least 10 nm and which, to prevent stress-induced deformation of the substrate shape and a decline in etchability, is preferably not more than 70 nm. An antireflective effect can be achieved by setting the antireflective film to a thickness of generally from 5 to 50 nm, and preferably from 10 to 30 nm, although the film thickness will vary also depending on the wavelength of the light used for the inspections required at the time of photomask production or use. For ArF excimer laser exposure in particular, a thickness of from 15 to 25 nm is preferred.

The thickness of the etching mask film may be suitably selected according to the film construction. An adequate etching mask function is generally achieved at a thickness of from 2 to 55 nm, and especially from 2 to 30 nm. Alternatively, this function can be elicited by setting the etching stopper film thickness to at least 2 nm, and especially at least 5 nm. The upper limit may generally be set to 20 nm or less, and especially 15 nm or less.

Figure 1B:
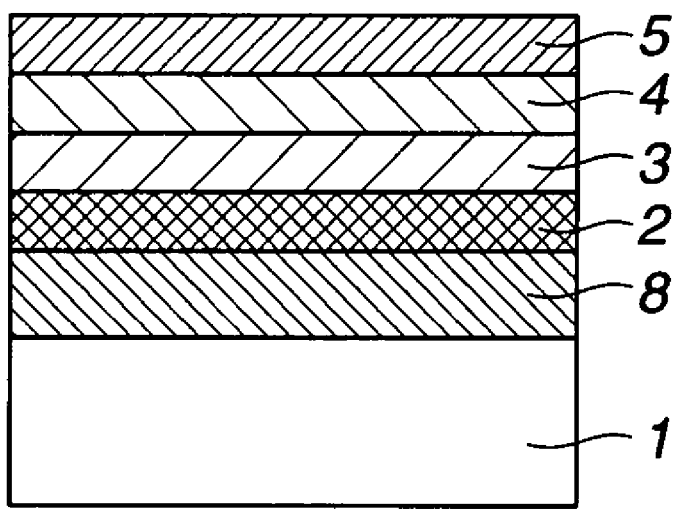
FIG. 1B is a cross-sectional view of a photomask blank in which the light-shielding film has been placed on the transparent substrate over an intervening phase shift film.

FIG. 1 shows examples of photomask blanks according to the present invention. The photomask blank shown in FIG. 1A has, deposited in order on a transparent substrate 1: an etching stopper film 2, a light-shielding film 3, an antireflective film 4 and an etching mask film 5. The photomask blank shown in FIG. 1B has, deposited in order on a transparent substrate 1: a phase shift film 8, an etching stopper film 2, a light-shielding film 3, an antireflective film 4 and an etching mask film 5.

Photomasks can be fabricated by employing an etching technique such as dry etching to pattern the films that have been deposited on the transparent substrate of the inventive photomasks blank, and if necessary to pattern the transparent substrate, using a chemically amplified positive-working or negative-working resist.

Next, examples of the fabrication of photomask blanks according to the invention are described. First, while referring to FIG. 2, an example is described (Fabrication Example A) in which a Levenson phase shift mask is fabricated using a photomask blank obtained by the successive deposition on a transparent substrate 1 of an etching stopper film 2 made of, e.g., chromium nitride, a light-shielding film 3 containing a transition metal, silicon and nitrogen, an antireflective film 4 containing a transition metal and silicon, and an etching mask film 5 made of, e.g., chromium nitride.

Figure 2A:
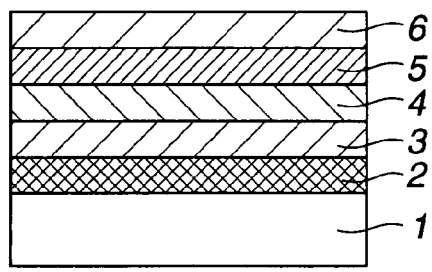
FIGS. 2A to 2H shows steps in the production of a photomask from a photomask blank according to the invention. Each diagram is a cross-sectional view of a step in the production of a Levenson mask (Fabrication Example A).
Figure 2B:
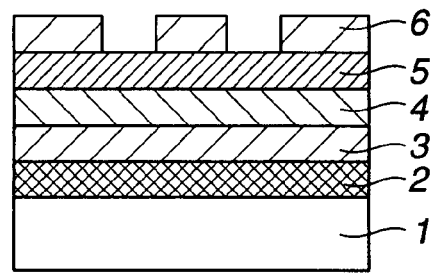
Figure 2C:
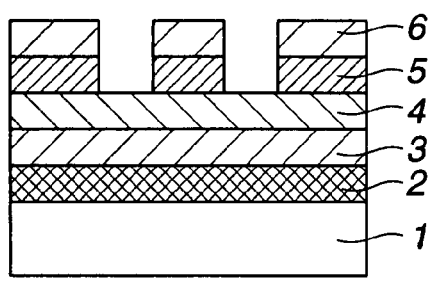
Figure 2D:
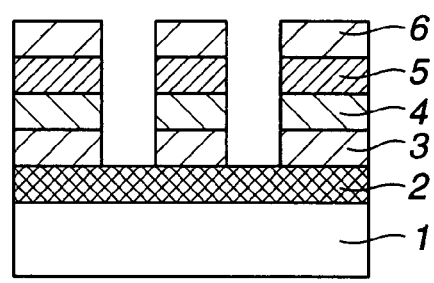
Figure 2E:
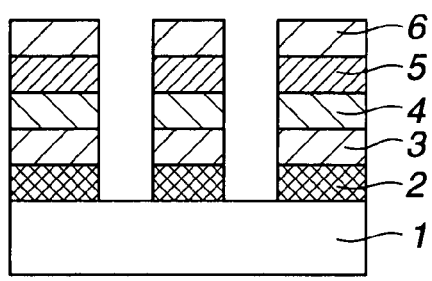

In this photomask fabrication, a first resist film 6 is deposited on the photomask blank (FIG. 2A) and a photoresist pattern in the shape of the phase shift pattern is formed therein by a lithographic process (FIG. 2B). The resist film here should have a thickness which is at least large enough to enable the etching stopper film 5 to be etched. Next, using this resist pattern as the etching mask, the underlying chrome-based material is dry etched under conventional dry etching conditions which include oxygen and chlorine, thereby transferring the pattern to the etching mask film 5 (FIG. 2C). Using the resulting etching mask pattern 5 as the etching mask, the pattern is then transferred to the antireflective film 4 and the light-shielding film 3 by fluorine-based dry etching (FIG. 2D). The etching stopper film 2 is subsequently patterned under, once again, dry etching conditions that include chlorine and oxygen (FIG. 2E). At this time, the presence of nitrogen in the light-shielding film 3 prevents the light-shielding film 3 from being side etched, as a result of which the workface (sidewall) remains perpendicular.

Figure 2F:
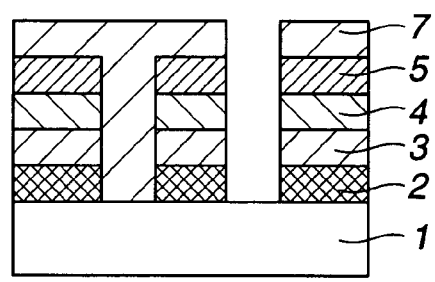
Figure 2G:
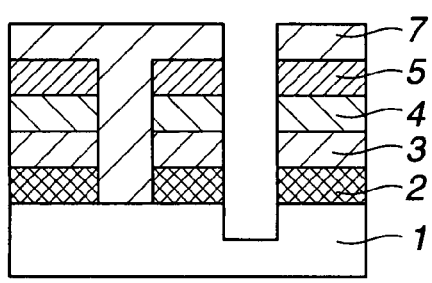
Figure 2H:
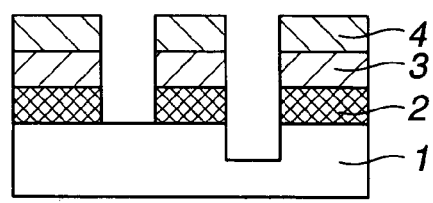

At this point, the initially formed first resist 6 pattern is stripped away, and a second resist film 7 is deposited so as form a resist pattern in which only areas where features are to be etched into the transparent substrate 1 have been left open (FIG. 2F). Using this second resist film 7 pattern as the etching mask, the transparent substrate 1 is etched by a fluorine-based dry etching process to a depth at which the phase of the exposure light to be employed at the time of photomask use will change about 180° (FIG. 2G). During this etching process, the chrome-based material film serving as the etching mask film 5 is exposed to strong etching conditions. However, by using an etching mask film 5 having a high chromium content, even if the edges of the resist pattern 7 recede, it is possible to keep the etching mask film 5 from receding and thus prevent the antireflective film 4 from incurring damage due to dry etching. The second resist film 7 is then stripped off by cleaning with sulfuric acid/peroxide aqueous solution or ammonia-hydrogen peroxide solution for resist stripping. Here too, the resist film 7 can be removed without damage to the nitrogen-containing light-shielding film 3. Finally, the etching mask film 5 is removed by a dry etching process which includes chlorine and oxygen. This keeps the antireflective film 4 and the patterned transparent substrate 1 from incurring significant damage, thus making it possible to obtain a Levenson phase shift mask having a high degree of accuracy (FIG. 2H).

Next, referring to FIGS. 3 and 4, an example is described in which the above photomask blank is used to fabricate a zebra-type chromeless phase shift mask (Fabrication Example B).

Figure 3A:
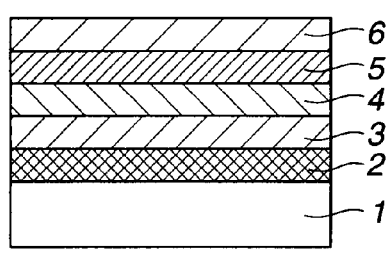
Figure 3B:
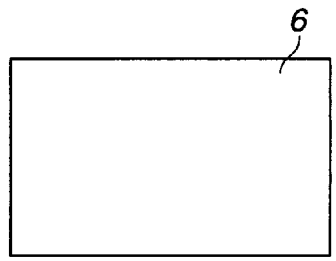
Figure 3C:
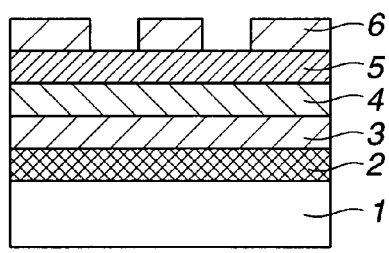
Figure 3D:
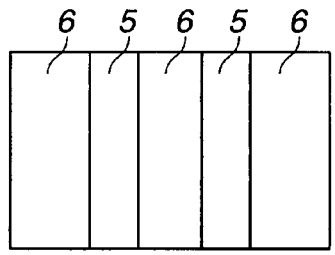
Figure 3E:
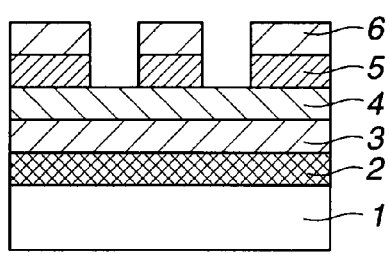
Figure 3F:
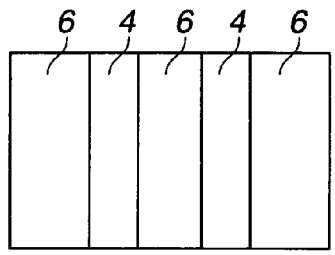
Figure 3G:
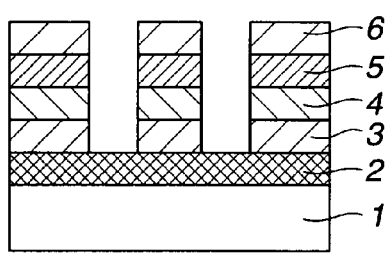
Figure 3H:
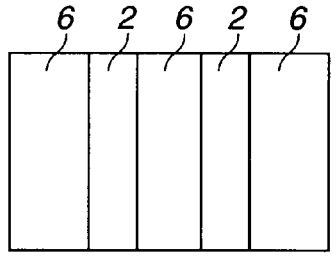
Figure 3I:
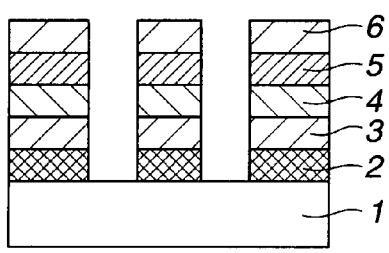
Figure 3J:
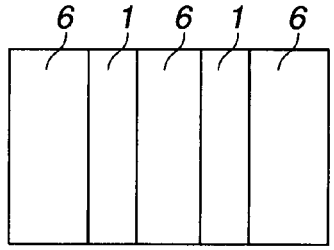

A first resist film 6 is deposited on top of a photomask blank composed of a transparent substrate 1 having thereon an etching stopper film 2, a light-shielding film 3, an antireflective film 4 and an etching mask film 5 (FIGS. 3A and 3B). The first resist film 6 is then patterned by a lithographic process so as to form openings in places where features are to be etched into the transparent substrate 1 (FIGS. 3C and 3D). Using this pattern in the first resist film 6 as the etching mask, etching is carried out under dry etching conditions which include chlorine and oxygen, thereby transferring the pattern to the etching mask film 5 (FIGS. 3E and 3F). Next, the antireflective film 4 and the light-shielding film 3 in the openings of the etching mask film 5 are removed by fluorine-based dry etching (FIGS. 3G and 3H), following which the etching stopper film 2 is removed by etching under dry etching conditions which include chlorine and oxygen (FIGS. 3I and 3J).

Figure 4A:
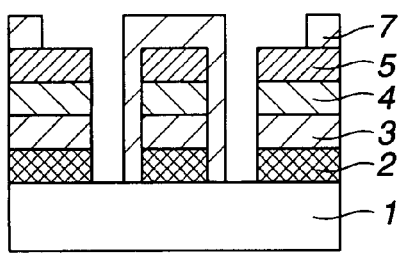
Figure 4B:
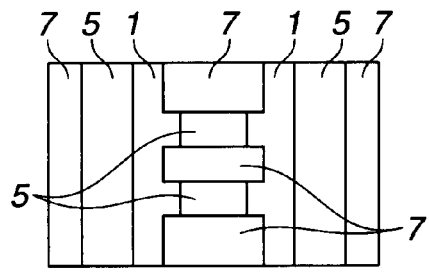
Figure 4C:
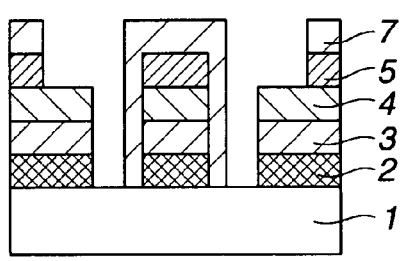
Figure 4D:
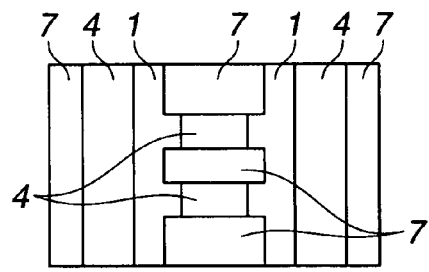

The first resist film 6 is then stripped off, a second resist film 7 is newly deposited, and a second resist film 7 pattern is formed that corresponds to the shape of areas where the light-shielding film 3 is to be left behind (FIGS. 4A and 4B). In cases where this pattern in the second resist film 7 ultimately becomes a pattern of very fine dots, because the regions where the transparent substrate 1 is already exposed are not target areas for etching using this second resist film 7 pattern, to prevent collapse of the fine dot pattern in the second resist film 7, the pattern in the second resist film 7 may be intentionally formed so as to extend out into such regions. Next, using this second resist film 7 pattern as the etching mask, etching is carried out under dry etching conditions which include chlorine and oxygen, thereby removing the etching mask film 5 in areas where the light-shielding film 3 is to be removed but the transparent substrate 1 is not to be etched (FIGS. 4C and 4D).

Figure 4E:
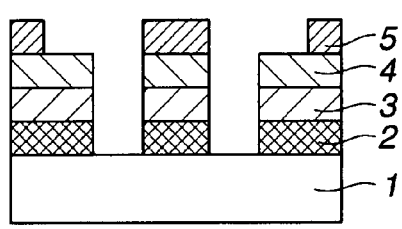
Figure 4F:
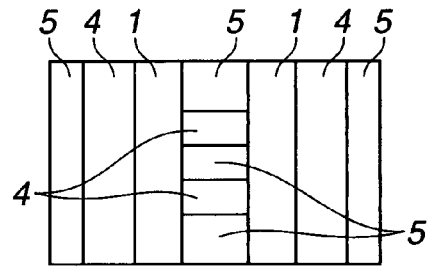
Figure 4G:
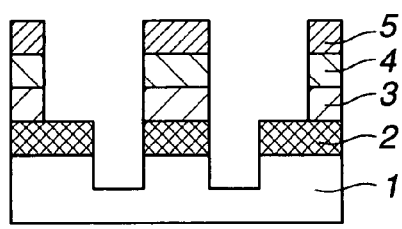
Figure 4H:
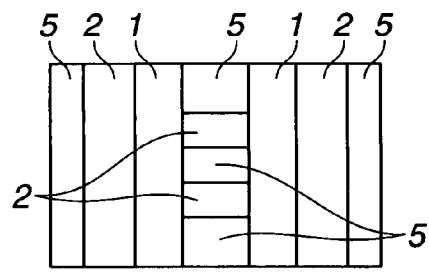
Figure 4I:
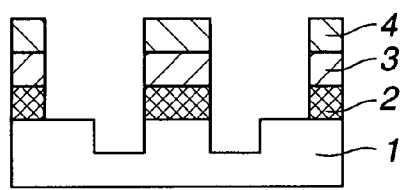
Figure 4J:
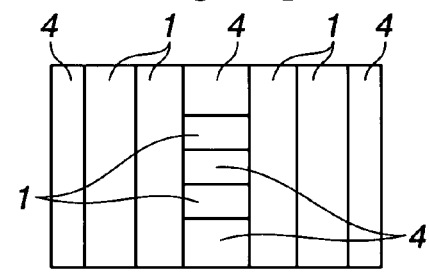

The second resist film 7 is subsequently stripped off (FIGS. 4E and 4F). Next, fluorine-based dry etching is carried out, thereby etching the transparent substrate 1 to a predetermined depth so that phase shifting features are formed, and additionally removing the antireflective film 4 and the light-shielding film 3 in areas where the etching mask film 5 was removed in the etching step carried out using the second resist film 7 pattern, leaving only the etching stopper film 2 in those areas (FIGS. 4G and 4H). Finally, etching is carried out under dry etching conditions which include chlorine and oxygen, thereby removing the exposed etching stopper film 2 and at the same time removing the as yet unremoved etching mask film 5 on the antireflective film 4 over the light-shielding film 3, thereby completing the phase shift mask (zebra-type chromeless mask) (FIGS. 4I and 4J).

As already explained above in Fabrication Example A, in this sequence of steps, during etching under dry etching conditions which include chlorine and oxygen, the transition metal, silicon and nitrogen-containing light-shielding film 3 having exposed sidewalls does not, owing the effects of the nitrogen, incur side etching. Nor does side etching arise in chemical treatment for removing the resist film.

Referring to FIG. 5, an example is also described in which a tritone phase shift mask is fabricated from a photomask blank composed of a transparent substrate 1 on which have been successively deposited a halftone phase shift film 8 composed of, e.g., a transition metal silicide oxynitride, an etching stopper film 2 composed of a chromium compound, a light-shielding film 3 containing a transition metal, silicon and nitrogen, an antireflective film 4 containing a transition metal and silicon, and an etching mask film 5 composed of a chrome-based material (Fabrication Example C).

Figure 5A:
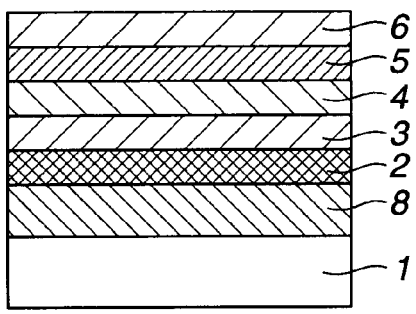
Figure 5B:
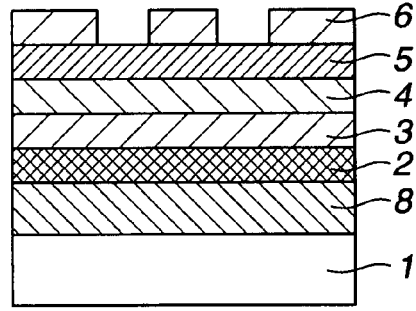
Figure 5C:
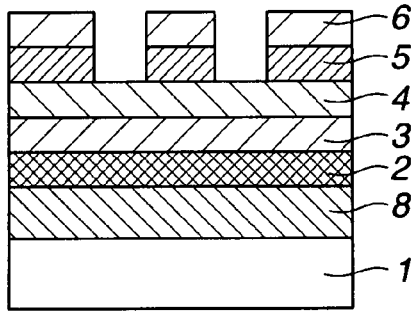
Figure 5D:
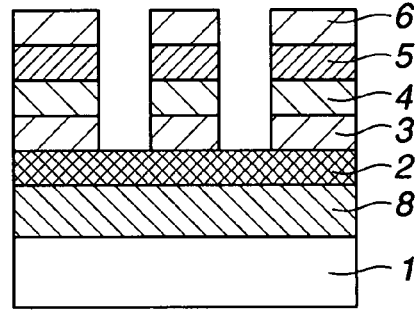

A first resist film 6 is deposited on the above photomask blank (FIG. 5A), following which the first resist film 6 is patterned in the shape of the areas to be left on the halftone phase shift film 8 (FIG. 5B). Next, using the resulting pattern in the first resist film 6 as the etching mask, the first resist film 6 pattern is transferred to the etching mask film 5 by etching under dry etching conditions which include chlorine and oxygen (FIG. 5C). Fluorine-based dry etching is then carried out, thereby transferring the first resist film 6 pattern to the antireflective film 4 and the light-shielding film 3 (FIG. 5D).

Figure 5E:
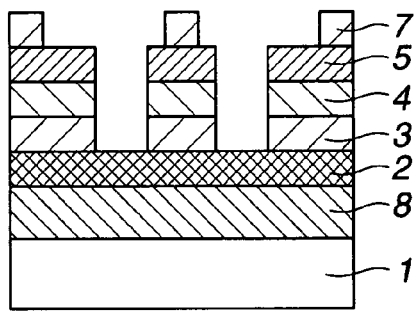
Figure 5F:
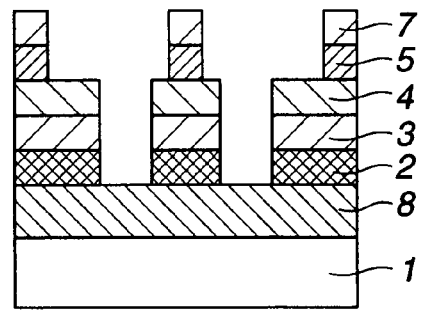
Figure 5G:
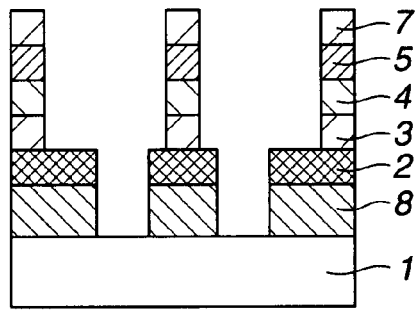
Figure 5H:
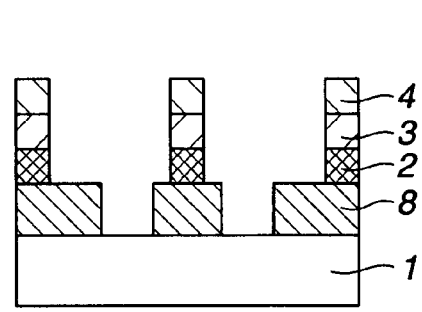

Next, the first resist film 6 is stripped off and a second resist film 7 is newly deposited to form a pattern in areas where the light-shielding film 3 is to remain and thereby protect the etching mask film 5 in those areas (FIG. 5E). The etching stopper film 2 is then etched and removed by dry etching under conditions which include chlorine and oxygen, thereby forming openings in areas where the halftone phase shift film 8 is to be removed, in addition to which the etching mask film 5 is removed in areas where the light-shielding film 3 is to be removed (FIG. 5F). Next, fluorine-based dry etching is carried out, thereby removing target areas of the halftone phase shift film 8 (at the openings in the etching stopper film 2), and also removing the antireflective film 4 and the light-shielding film 3 in areas not protected by the second resist film 7 (FIG. 5G). The second resist film 7 is then stripped away and etching under dry etching conditions which include chlorine and oxygen is again carried out, thereby removing the etching stopper film 2 remaining in areas of the light-shielding film 3 targeted for removal and also removing the as yet unremoved etching mask film 5 on the antireflective film 4 over the light-shielding film 3. In this way, all areas targeted for removal in the respective films are removed without damaging the transparent substrate 1 or the halftone phase shift film 8, yielding a completed tritone phase shift mask (FIG. 5H).

Here too, as already explained above for Fabrication Example A, in this sequence of steps, during etching under dry etching conditions which include chlorine and oxygen, the transition metal, silicon and nitrogen-containing light-shielding film 3 having exposed sidewalls does not, owing to the effects of the nitrogen, incur side etching. Nor does side etching arise in chemical treatment for removing the resist film.

It is also possible to produce phase shift masks such as a halftone phase shift mask or a chromeless phase shift mask from the photomask blank of the invention.

Photomask blanks according to the invention are beneficial as photomask blanks having both an electrical conductivity and a chemical stability suitable for practical use in the production of photomasks by electron beam lithography, particularly e-beam lithography at an increased current density during e-beam exposure, such as e-beam lithography which employs current densities of 40 A/cm$^2$ or more, and especially 50 to 80 A/cm$^2$.

EXAMPLES

The Experiments and Examples below are given by way of illustration and not by way of limitation.

Experiments 1 to 15

Sputtering was carried out using separate molybdenum and silicon targets in an argon atmosphere or an atmosphere of argon gas and nitrogen gas while adjusting the applied power, thereby depositing the MoSi-based material films 1 to 15 (film thickness, 39 nm) shown in Table 1 onto a transparent substrate made of quartz. The film was then immersed for one hour in an ammonia-peroxide mixture (ammonia water/aqueous hydrogen peroxide/water=1:1:30 by volume), and the change (decrease) in film thickness was measured. The change in film thickness and the optical density of each film is indicated in the table below. At a nitrogen content below 5 atom %, the film lacked a sufficient chemical resistance, whereas at a nitrogen content above 40 atom %, the optical density was low, making the film unsuitable for use as a light-shielding film. It was confirmed that at a nitrogen content of 40% or less, the sheet resistivity can be set to 1 kΩ/□ by setting the silicon/(silicon+transition metal) ratio to 75% or below.

TABLE 1

|  |  | | Mo:Si:N (atomic ratio) | Nitrogen content (atom %) | Change in film thickness (nm) | Optical density | Conductivity $\Omega/\square$ |
|---|---|---|---|---|---|---|---|
| Experiment | 1 | MoSi film 1 | 1:1:0.11 | 5.2 | 0.5 | 2.4 | $4.6 \times 10^1$ |
|  | 2 | MoSi film 2 | 1:1:0.33 | 14.2 | 0.2 | 2.2 | $6.4 \times 10^1$ |
|  | 3 | MoSi film 3 | 1:1:0.86 | 30.0 | 0.4 | 1.9 | $1.5 \times 10^2$ |
|  | 4 | MoSi film 4 | 1:1:1 | 33.3 | 0.1 | 1.9 | $1.6 \times 10^2$ |
|  | 5 | MoSi film 5 | 1:3:0.22 | 5.2 | 0.1 | 2.8 | $2.4 \times 10^2$ |
|  | 6 | MoSi film 6 | 1:3:0.66 | 14.2 | 0.3 | 2.6 | $3.3 \times 10^2$ |
|  | 7 | MoSi film 7 | 1:3:1.72 | 30.0 | 0.2 | 2.3 | $7.4 \times 10^2$ |
|  | 8 | MoSi film 8 | 1:3:2 | 33.3 | 0.3 | 2.2 | $7.5 \times 10^2$ |
|  | 9 | MoSi film 9 | 1:1:0 | 0 | film vanished | 2.3 | $3.8 \times 10^1$ |
|  | 10 | MoSi film 10 | 1:1:0.05 | 2.4 | 11.4 | 2.4 | $4.1 \times 10^1$ |
|  | 11 | MoSi film 11 | 1:1:2 | 50.0 | 0.1 | 1.2 | $4.0 \times 10^6$ |
|  | 12 | MoSi film 12 | 1:3:0 | 0 | 2.6 | 2.8 | $2.0 \times 10^2$ |
|  | 13 | MoSi film 13 | 1:3:0.10 | 2.4 | 0.8 | 2.8 | $2.1 \times 10^2$ |
|  | 14 | MoSi film 14 | 1:3:4 | 50.0 | 0.3 | 0.9 | $2.5 \times 10^7$ |
|  | 15 | MoSi film 15 | 1:5:3 | 33.3 | 0.4 | 2.4 | $4.4 \times 10^3$ |

Examples 1 to 5 and Comparative Examples 1 to 4

A CrN film (atomic ratio, Cr:N=9:1; film thickness, 10 nm) was deposited as an etching stopper film on a transparent substrate by carrying out sputtering using a chromium target in an argon gas and nitrogen gas atmosphere. In the respective examples, one of the above-described MoSi films 1, 5 to 10, 12 and 13 was deposited on the etching stopper film, on top of which was then deposited a CrON film (atomic ratio, Cr:O:N=4:5:1; film thickness, 20 nm) as an antireflective film by carrying out sputtering with a chromium target in an argon gas, nitrogen gas and oxygen gas atmosphere, thereby giving a photomask blank.

Resist was then applied onto the antireflective film, and a pattern of 5 μm lines and spaces was formed by e-beam lithography. Using this resist pattern as the etching mask, the CrON film (antireflective film) was etched by introducing into the etching chamber an etching gas prepared by mixing together chlorine gas, oxygen gas and helium gas at respective flow rates of 20 sccm, 9 sccm and 80 sccm, and carrying out dry etching at a chamber internal pressure of 2 Pa. Next, $C_2F_6$ gas by itself was let into the etching chamber at a flow rate of 20 sccm, and etching of the MoSi film (light-shielding film) was carried out at a chamber internal pressure of 2 Pa. The CrN film (etching stopper film) was then dry etched under, again, the above-described dry etching conditions which include chlorine and oxygen, thereby giving a photomask model. The shape of the pattern thereon was examined under a scanning electron microscope. The results are shown in Table 2.

Example 6

A photomask blank having the film construction shown in FIG. 1A was produced by using sputtering processes to deposit the respective films. The individual films were as follows.

Transparent substrate: Quartz substrate

Etching stopper film: CrN (CR:N=9:1 (atomic ratio); film thickness, 10 nm)

Light-shielding film: MoSiN (Mo:Si:N=1:3:1.5 (atomic ratio); film thickness, 41 nm)

Antireflective film: MoSiN (the composition was graduated in the thickness direction, being Mo:Si:N=1:3:1.5 (atomic ratio) on the light-shielding film side and Mo:Si:N=1:5:5 (atomic ratio) on the side away from the transparent substrate (etching mask film side); film thickness, 18 nm)

Etching mask film: CrN (Cr:N=9:1 (atomic ratio); film thickness, 10 nm)

This photomask blank was processed in accordance with photomask Fabrication Example A described above, thereby producing a Levenson mask.

Chemically amplified negative resist films composed primarily of a hydroxystyrene resin, a crosslinking agent and an acid generator were used as the first resist film and the second resist film. Each film was set to a thickness of 250 nm and patterned by e-beam lithography. The depth of the phase shifting portions formed in the transparent substrate was set to 172 nm, which is the depth at which the phase shifts about 180°.

TABLE 2

|  |  | | Mo:Si (atomic ratio) | Nitrogen content (atom %) | Pattern shape |
|---|---|---|---|---|---|
| Example | 1 | MoSi film 1 | 1:1 | 5.2 | no narrowing of features |
|  | 2 | MoSi film 5 | 1:3 | 5.2 | no narrowing of features |
|  | 3 | MoSi film 6 | 1:3 | 14.2 | no narrowing of features |
|  | 4 | MoSi film 7 | 1:3 | 30.0 | no narrowing of features |
|  | 5 | MoSi film 8 | 1:3 | 33.3 | no narrowing of features |
| Comparative Example | 1 | MoSi film 9 | 1:1 | 0 | large steps |
|  | 2 | MoSi film 10 | 1:1 | 2.4 | stepped |
|  | 3 | MoSi film 12 | 1:3 | 0 | large steps |
|  | 4 | MoSi film 13 | 1:3 | 2.4 | stepped |

A photomask was obtained that reflected well the selected pattern size regardless of how sparse or dense the pattern, demonstrating that the photomask blank had little density dependence. Moreover, during etching of the light-shielding film, the substrate did not erode. Hence, it was possible to form in the substrate phase shifting portions having a predetermined amount of phase shift.

Example 7

A photomask blank having the film construction shown in FIG. 1A was produced by using sputtering processes to deposit the respective films. The individual films were as follows.
Transparent substrate: Quartz substrate
Etching stopper film: CrN (CR:N=9:1 (atomic ratio); film thickness, 10 nm)
Light-shielding film: MoSiN (Mo:Si:N=1:3:1.5 (atomic ratio); film thickness, 41 nm)
Antireflective film: MoSiN (the composition was graduated in the thickness direction, being Mo:Si:N=1:3:1.5 (atomic ratio) on the light-shielding film side and Mo:Si:N=1:5:5 (atomic ratio) on the side away from the transparent substrate (etching mask film side); film thickness, 18 nm)
Etching mask film: CrN (Cr:N=9:1 (atomic ratio); film thickness, 10 nm)

This photomask blank was processed in accordance with photomask Fabricating Example B described above, thereby producing a zebra-type chromeless mask.

Chemically amplified negative resist films composed primarily of a hydroxystyrene resin, a crosslinking agent and an acid generator were used as the first resist film and the second resist film. Each film was set to a thickness of 200 nm and patterned by e-beam lithography. The depth of the phase shifting portions formed in the transparent substrate was set to 172 nm, which is the depth at which the phase shifts about 180°.

A photomask was obtained that reflected well the selected pattern size regardless of how sparse or dense the pattern, demonstrating that the photomask blank had little density dependence. Moreover, during etching of the light-shielding film, the substrate did not erode. Hence, it was possible to accurately form in the substrate phase shifting portions having a predetermined amount of phase shift.

Example 8

A photomask blank having the film construction shown in FIG. 1B was produced by using sputtering processes to deposit the respective films. The individual films were as follows.
Transparent substrate: Quartz substrate
Halftone phase shift film: MoSiON film (Mo:Si:O:N=1:4:1:4 (atomic ratio); film thickness, 75 nm)
Etching stopper film: CrN (CR:N=9:1 (atomic ratio); film thickness, 10 nm)
Light-shielding film: MoSiN (Mo:Si:N=1:3:1.5 (atomic ratio); film thickness, 41 nm)
Antireflective film: MoSiN (the composition was graduated in the thickness direction, being Mo:Si:N=1:3:1.5 (atomic ratio) on the light-shielding film side and Mo:Si:N=1:5:5 (atomic ratio) on the side away from the transparent substrate (etching mask film side); film thickness, 18 nm)
Etching mask film: CrN (Cr:N=4:1 (atomic ratio); film thickness, 10 nm)

This photomask blank was processed in accordance with photomask Fabrication Example C described above, thereby producing a tritone phase shift mask.

Chemically amplified negative resist films composed primarily of a hydroxystyrene resin, a crosslinking agent and an acid generator were used as the first resist film and the second resist film. Each film was set to a thickness of 250 nm and patterned by e-beam lithography.

A photomask was obtained that reflected well the selected pattern size regardless of how sparse or dense the pattern, demonstrating that the photomask blank had little density dependence. Moreover, during etching of the light-shielding film, the phase shift film and the substrate did not erode. Hence, it was possible to accurately form in the substrate phase shifting portions having a predetermined amount of phase shift.

Japanese Patent Application No. 2006-117327 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank for producing a photomask having a transparent substrate provided thereon with a mask pattern of regions transparent to and regions substantially opaque to an exposure light, comprising:
    a light-shielding film composed of a single layer made of a material containing a transition metal, silicon and nitrogen or a plurality of layers that include at least one layer made of a material containing a transition metal, silicon and nitrogen, and
    one or more chrome-based material film;
wherein the material containing a transition metal, silicon and nitrogen has an atomic ratio of silicon to transition metal, expressed as silicon/transition metal, of at least 1:1 but less than 4:1, and has a nitrogen content of least 5 atom % but not more than 40 atom %.

2. The photomask blank of claim 1, wherein the layer made of a material containing a transition metal, silicon and nitrogen has a combined amount of transition metal and silicon, as a proportion of the material making up the layer, of at least 60 atom %.

3. The photomask blank of claim 1, wherein the chrome-based material film is formed in a side of the light-shielding film that is away from the transparent substrate.

4. The photomask blank of claim 3, wherein the chrome-based material film forms part or all of an antireflective film.

5. The photomask blank of claim 3, wherein the chrome-based material film is an etching mask film.

6. The photomask blank of claim 1, wherein the chrome-based material film is formed between the transparent substrate and the light-shielding film.

7. The photomask blank of claim 6, wherein the chrome-based material film is an etching stopper film.

* * * * *